United States Patent [19]

Park

[11] Patent Number: 5,600,812
[45] Date of Patent: Feb. 4, 1997

[54] VARIABLE-LENGTH-CODE DECODERS STORING DECODING RESULTS AND CORRESPONDING CODE-BIT-LENGTH INFORMATION IN MEMORY

[75] Inventor: Heon-chul Park, Kyungki-do, Rep. of Korea

[73] Assignee: Samsung Electronics Co., Ltd., Kyungki-do, Rep. of Korea

[21] Appl. No.: 434,006

[22] Filed: May 3, 1995

[30] Foreign Application Priority Data

Jun. 30, 1994 [KR] Rep. of Korea ..................... 94-15677

[51] Int. Cl.$^6$ .............................. G06F 9/26; G06F 9/34; G06F 12/00; G06F 12/02
[52] U.S. Cl. ........................ 395/410; 395/412; 395/416
[58] Field of Search ................................ 395/410, 416, 395/412; 341/65, 67

[56] References Cited

U.S. PATENT DOCUMENTS 5,325,092  6/1994  Allen et al. .............................. 341/65

OTHER PUBLICATIONS

"High speed pattern matching for a fast Huffman decoder", Seung Bae Choi et al. IEEE Transactions on Conumer Electronics, vol. 41, No. 1 Feb. 1995.

"Memory efficient and high–speed search Huffman coding", Reza Hashemian IEEE transactions on communications, vol. 43, No. 10 Oct. 1995.

*Primary Examiner*—David K. Moore
*Assistant Examiner*—Than V. Nguyen
*Attorney, Agent, or Firm*—Allen LeRoy Limberg

[57] ABSTRACT

A decoder uses look-up table memory for variable-length coding (such as Huffman coding) that comprises concatenated variable-length codes, most species of which codes can each be analyzed as being composed of a pointer subcode of variable bit-length and a target subcode of fixed bit-length, the target subcodes being relatively efficiently encoded and the pointer subcodes being relatively inefficiently encoded. The memory stores not only decoding results, but the bit-lengths of the codes generating those results. The bit-lengths of the concatenated codes are accumulated and the accumulation result in modular arithmetic is supplied to as shift control signal to a data shifter. The data shifter positions each successive one of the concatenated codes within a window so the leadmost bit of the code is positioned at the edge of the window. The pointer subcodes are decoded, applied to address lines of the memory, and used to select target subcodes to an address decoder. The target subcodes are decoded by the address decoder and applied to further address lines of the memory.

4 Claims, 9 Drawing Sheets

FIG. 4

| | VARIABLE LENGTH CODE (VLC) | INCREASING VALUE (CONTENT OF CODE) |
|---|---|---|
| 8TH ADDRESS SUBRANGE | 1 | 1 |
| | 011 | 2 |
| | 010 | 3 |
| 7TH ADDRESS SUBRANGE | 0011 | 4 |
| | 0010 | 5 |
| | 0001 1 | 6 |
| 6TH ADDRESS SUBRANGE | 0001 0 | 7 |
| | 0000 111 | 8 |
| 5TH ADDRESS SUBRANGE | 0000 110 | 9 |
| | 0000 1011 | 10 |
| | 0000 1010 | 11 |
| | 0000 1001 | 12 |
| | 0000 1000 | 13 |
| | 0000 0111 | 14 |
| 4TH ADDRESS SUBRANGE | 0000 0110 | 15 |
| | 0000 0101 11 | 16 |
| | 0000 0101 10 | 17 |
| | 0000 0101 01 | 18 |
| | 0000 0101 00 | 19 |
| 3RD ADDRESS SUBRANGE | 0000 0100 11 | 20 |
| | 0000 0100 10 | 21 |
| | 0000 0100 011 | 22 |
| | 0000 0100 010 | 23 |
| | 0000 0100 001 | 24 |
| | 0000 0100 000 | 25 |
| 2ND ADDRESS SUBRANGE | 0000 0011 111 | 26 |
| | 0000 0011 110 | 27 |
| | 0000 0011 101 | 28 |
| | 0000 0011 100 | 29 |
| | 0000 0011 011 | 30 |
| | 0000 0011 010 | 31 |
| | 0000 0011 001 | 32 |
| | 0000 0011 000 | 33 |
| 1ST ADDRESS SUBRANGE | 0000 0001 111 | 34 (MACROBLOCK STUFFING) |
| | 0000 0001 000 | 35 (MACROBLOCK ESCAPE) |

HUFFMAN DECODING TABLE

FIG. 6

| | VARIABLE LENGTH CODE (VLC) | INCREASING VALUE (CONTENT OF CODE) |
|---|---|---|
| 8TH ADDRESS SUBRANGE | 1 | 1 |
| | 011 | 2 |
| | 010 | 3 |
| 7TH ADDRESS SUBRANGE | 0011 | 4 |
| | 0010 | 5 |
| | 0001 1 | 6 |
| | 0001 0 | 7 |
| 6TH ADDRESS SUBRANGE | 0000 111 | 8 |
| | 0000 110 | 9 |
| | 0000 1011 | 10 |
| | 0000 1010 | 11 |
| | 0000 1001 | 12 |
| | 0000 1000 | 13 |
| 5TH ADDRESS SUBRANGE | 0000 0111 | 14 |
| | 0000 0110 | 15 |
| 4TH ADDRESS SUBRANGE | 0000 0101 11 | 16 |
| | 0000 0101 10 | 17 |
| | 0000 0101 01 | 18 |
| | 0000 0101 00 | 19 |
| 3RD ADDRESS SUBRANGE | 0000 0100 11 | 20 |
| | 0000 0100 10 | 21 |
| | 0000 0100 011 | 22 |
| | 0000 0100 010 | 23 |
| | 0000 0100 001 | 24 |
| | 0000 0100 000 | 25 |
| 2ND ADDRESS SUBRANGE | 0000 0011 111 | 26 |
| | 0000 0011 110 | 27 |
| | 0000 0011 101 | 28 |
| | 0000 0011 100 | 29 |
| | 0000 0011 011 | 30 |
| | 0000 0011 010 | 31 |
| | 0000 0011 001 | 32 |
| | 0000 0011 000 | 33 |
| 1ST ADDRESS SUBRANGE | 0000 0001 111 | 34 (MACROBLOCK STUFFING) |
| | 0000 0001 000 | 35 (MACROBLOCK ESCAPE) |

HUFFMAN DECODING TABLE

VARIABLE-LENGTH-CODE DECODERS STORING DECODING RESULTS AND CORRESPONDING CODE-BIT-LENGTH INFORMATION IN MEMORY

The present invention relates to decoders for variable-length coding (such as Huffman coding) that comprises concatenated variable-length codes, most species of which codes can each be analyzed as being composed of a pointer subcode of variable bit-length and a target subcode of fixed bit-length, the target subcodes being relatively efficiently encoded and the pointer subcodes being relatively inefficiently encoded.

BACKGROUND OF THE INVENTION

In image compression algorithms such as MPEG, JPEG, pX64(H.261) and the like, established as international standards for multimedia, frames of digitized image-dependent signal data-compressed by removing image redundancies are subjected to a block transform called discrete cosine transform (DCT). Further data-compression is achieved by entropy encoding of the quantized discrete cosine transform (DCT) of each image block, in which entropy encoding variable-length codes (VLC) descriptive of components of the DCT are selected from a coding table arranged according to the respective statistical characteristics of these components—i. e., the frequency in which various values of that DCT component are likely to occur for encoding. This is a lossless coding process separate from the quantization process. Entropy codes include the Huffman, arithmetic and universal codes. The DCT is encoded using variable-length-coding (VLC) such as Huffman coding. Each DCT block is expressed as a DC coefficient and a group of AC coefficients, the DC coefficients usually being encoded differently from the AC coefficients. Since generally the DC coefficient of each block has a high correlation with the DC coefficients of peripheral blocks, the usual procedure for coding the DC coefficient of each block is to determine its difference from the DC coefficient of the previously encoded block, which difference is then Huffman encoded to generate a one-dimensional variable-length code. The difference of the DC coefficient of the block to be initially encoded is usually determined by subtracting therefrom the median value of the available range for DC coefficients. The Huffman coding of the differential DC coefficient is done according to a code look up table selected in accordance with factors such as the type of image frame being coded. Also, the AC coefficients are converted from a multi-dimensional vector into one dimension by zigzag scanning. Replacing AC coefficients less than a threshold value with zeroes and ignoring trailing zero coefficients results in data compression, owing to the higher probability that the AC coefficient value is not "0" near the DC coefficient but is "0" far from the DC coefficient in DCT region. Then, the number of consecutive "0" and the value of coefficient not "0" are expressed in two dimensions, that is, zero-run and level, respectively. For example, the DCT coefficient arrangement, such as 30, 2, 0, 0, −8, 0, 0, 0, 9, . . . , which is achieved through zigzag scanning, is expressed as (0,30), (0,2), (2,−8) and (3,9) through the zero-run and level encoding. The zero-run and level symbols are converted to variable-length-coding (VLC) using Huffman coding according to one of second through $N^{th}$ code look up tables, N being an integer. The code look up table that is used is selected by a classifier for the AC coefficients, which classifier may operate in dependence on the zero-run and level symbols for the DCT block.

The Huffman coding strings follow prefix codes that signal the starts of the Huffman codes. The Huffman coding strings and their prefix codes follow an image header code that contains coded information concerning the number and type of image frame described by the following code, the position in the frame of the image blocks generating the DCT blocks being coded and the identification of the code tables used during Huffman coding. In a multimedia system the image header code is usually part of a packet header code containing a use or routing code identifying the use to which a following packet of code will be put. The complete coded description of the image comprising the components described above is transmitted by the transmitting end of the system.

At the receiving end of the multimedia system, the use or routing code in the packet header code is detected to route the packet to the image reproducing equipment, in which equipment the use or routing code enables the detection of the image header codes and the prefix codes by a host processor including coders designed for such decoding. Thereafter, a Huffman decoder is used to decode the variable-length Huffman code strings. The detection of the prefix codes provides start signals to be used to start the parsing of Huffman code strings by the Huffman decoder, and the detection of appropriate portions of the image header supplies lookup table selection codes for use by the Huffman decoder. The conventional Huffman decoders for multimedia either utilize tree searching or utilize a look-up table (LUT) stored in read-only memory (ROM) to decode the variable-length decoding. The decoding can be such as to convert the variable-length code to fixed-length code descriptions of DCT coefficients, for example. The variable-length code input for one fixed-length output word is generally composed of no more than 24 bits. Theoretically, the length of an input string for a fixed-length output word of n bits can be expressed in $2^n-1$ or fewer bits.

In the conventional tree search method of Huffman decoding, the size of the search memory required for code conversion can be minimized. However, the search time is relatively long due to the characteristics of tree searching. As a result, it is difficult for the tree search method to be applied to an apparatus requiring fast processing, e.g., to digital television, HDTV or the like.

Alternatively, the search time can be reduced by using a look-up table (LUT) stored in code-addressed memory for decoding variable-length codes directly. The variable-length code input is supplied to a shift register used as an input address register for LUT memory. The LUT memory address in this input address register is supplied to address decoders within the LUT memory that generate selection signals for storage elements in each addressable storage location. The LUT memory stores the decoding results for each valid variable-length code at each addressable location specified by a LUT memory address having that valid variable-length code as its leading bits. So, when a valid variable-length code provides the leading bits of a LUT memory address, that input address to the LUT memory is accepted as a valid address by the LUT memory. The LUT memory reads out the decoding result corresponding to the valid variable-length code, which decoding result is stored at the validly addressed storage location. Any input address except one in which a valid variable-length code provides the leading bits of the LUT memory address is invalid. In response to any invalid input address, the LUT memory reads out a null result that indicates the LUT memory address is invalid and is thereafter discarded. However, this simple LUT decoding method requires increased memory size, so the die area in a very-large-scale-integrated (VLSI) circuit comprising the Huffman decoder tends to be undesirably large.

These increases in memory size for simple LUT decoding arise with conventional memory layout procedures where storage locations are provided for all addresses of a fixed bit width, when that bit-width is chosen equal to the longest variable-length code. One reason for increased memory size is that the decoding results for each variable-length code are stored at a number of addressable storage locations in the LUT memory, each having a valid address, the number of those addressable storage locations increasing as the variable-length code becomes shorter.

Another reason for increased memory size with LUT decoding is that only a portion of the possible input addresses for the LUT memory are valid addresses. If conventional memory layout procedures are used, to provide a general type of memory configuration that contains storage locations for all input addresses, the storage locations associated with invalid input addresses contain only coding nulls and are wasted. Furthermore, the memory addressing decoders must decode all input addresses, whether they are valid or invalid, in order to select the variable-length decoding results only in response to the valid variable-length codes as correctly positioned in the shift register supplying memory input addresses. Accordingly, the address coding circuitry takes up appreciable space on the die.

SUMMARY OF THE INVENTION

The invention in a first of its aspects is embodied in a decoder for variable-length codes, which VLC decoder includes a look-up table memory that stores, in a storage location with the same address as the storage location of the decoding result for a variable-length code, an indication of the bit-length of that variable-length code. When one of the variable-length codes is decoded, both the decoding result and the indication of the bit-length of the variable-length code that has been decoded are read from the look-up table memory. The bit-length indication is used to shift the variable-length code within the input address register so as to place the next variable-length-code (VLC) word directly into the final position within the address register. This eliminates having to consider most of the invalid addresses and can speed up the time between most table look-ups. These advantages arise because remnants of valid variable-length codes with a plurality of bits do not need to be shifted from the input address register one bit at a time after respective valid addresses before the next valid addresses occur.

Since storage locations associated with invalid addresses need never be addressed in any case in a VLC decoder embodying the first aspect of the invention, the storage elements for most of these storage locations are dispensed with in the look up table memories of preferred decoders embodying a second aspect of the invention. This provides an overall reduction in memory even though each remaining set of storage locations with the same address is increased in size, to include storage locations for storing the indication of the bit-length of the variable-length code giving rise to the decoding result stored in storage locations with the same address.

In those of the preferred VLC decoders constructed in accordance with a third aspect of the invention, division of the complete content of the :input address register into two portions that are considered as binary-coded row and column addresses for the memory is avoided, since this results in an excess of address lines with a large number of invalid addresses. Even though storage elements for these storage locations with invalid addresses are dispensed with, the regularity of memory layout is undesirably disrupted, making compact memory layout difficult to achieve. In certain variable-length coding such as Huffman coding that comprises concatenated variable-length codes, most of the codes in each codeset can be analyzed as being composed of a pointer subcode of variable bit-length and a target subcode of fixed bit-length, the target subcodes being relatively efficiently encoded and the pointer subcodes being relatively inefficiently encoded. The pointer subcode can be recoded more efficiently and used together with the target subcode to provide more efficiently encoded memory addressing.

In those of the preferred VLC decoders constructed in accordance with a fourth aspect of the invention, the pointer subcode is decoded more as a positional code than a binary code to reduce the number of address lines accessed by the decoding result for the pointer subcode.

In those of the preferred VLC decoders constructed in accordance with a fifth aspect of the invention, the efficiently encoded target subcode, as selected from the complete content of the input address register by a multiplexer controlled by the decoded pointer subcode, is decoded as a binary code, and further address lines are accessed by the decoding result for the target subcode. This procedure for selecting portions of the complete input address register content for address decoding excludes those portions that are not in the currently considered code, which further reduces the number of memory address lines.

A decoder for decoding variable-length coding composed of concatenated variable-length codes, which VLC decoder is a preferred embodiment of the invention, includes a controlled data shifter within its input address register. The controlled data shifter is receptive of unshifted variable-length coding and, responsive to a shift indication supplied thereto, shifts a selected portion of the variable-length coding to be positioned within an output window as wide as the longest variable-length code. The shift indication is a binary number indicative of a number of bit places of desired shift for the selected portion of the variable-length coding to be positioned within the output window of the controlled data shifter. An accumulator accumulates code bit-length indications to generate the shift indication. A first memory has a plurality of addressable storage locations each of which is accessed for reading at first times. The first memory has addressable storage locations read from responsive to the selected portion of the variable-length coding as positioned within the output window of the controlled data shifter. At each of its addressable storage locations, the first memory stores a decoding result for a first decoding table and further stores a binary number descriptive of the code bit-length of a variable-length code as would give rise to the decoding result stored at that addressable storage location. Each of the addressable storage locations in the first memory that is successively addressed during the first times supplies the decoding result and the code bit-length which are stored at that addressable storage location. The code bit-length read from the first memory during those first times is supplied to the accumulator for accumulation to generate the shift indication received by the controlled data shifter.

A VLC decoder as described in the preceding paragraph can further include a second memory having a plurality of addressable storage locations each of which is at second times accessed for reading responsive to the selected portion of said variable-length coding as positioned within the output window of the controlled data shifter. At each of its addressable storage locations the second memory stores a decoding result for a second decoding table and further stores a binary number descriptive of the bit-length of a variable-length code as would give rise to the decoding result stored at that addressable storage location. Each of the addressable storage locations in the second memory that is successively addressed during the second times supplies the decoding result and the code bit-length which are stored at that addressable storage location. The code bit-length read from the second memory during those second times is supplied to the accumulator for accumulation to generate the shift indication received by the controlled data shifter. Still further memories storing further decoding look-up tables can be included in the decoder.

A VLC decoder as described in the preceding two paragraphs that is particularly well suited for use with variable-length codes at least some of which are composed of pointer and target subcodes has first memory with address lines for accessing its addressable storage locations and has first memory addressing circuitry that drives its address lines in response to the selected portion of the variable-length coding as positioned within the output window of the controlled data shifter. This first memory addressing circuitry comprises a bin comparator for decoding the pointer subcode; an address decoder for decoding the target subcode; and a multiplexer responding to the decoded pointer subcode for selecting, from the portion of the variable-length coding positioned within the output window of the controlled data shifter, the target subcode applied to the address decoder. The bin comparator is connected to respond to ones of the leadmost bits of the portion of the variable-length coding positioned within the output window of the controlled data shifter, which leadmost bits can describe a pointer subcode. The bin comparator has output connections connecting to respective ones of a first group of some but not all of the address lines of the first memory. The bin comparator supplies a respective bin response to each pointer subcode and a further bin response to the lack of a pointer subcode, which bin responses are supplied from respective ones of its output connections. The multiplexer responds to the bin responses of the bin comparator for selecting the target subcode to the address decoder. The address decoder for the target subcode has respective output connections to respective ones of a second group of the address lines of the first memory, which second group contains those of the address lines of the first memory not contained in the first group.

BRIEF DESCRIPTION OF THE DRAWING

FIG. 4 is an example of the Huffman decoding table used in the FIG. 1 or FIG. 3 decoder for variable-length codes.

FIG. 6 repeats the FIG. 4 Huffman decoding table, but shows the codes being partitioned differently for modified address circuitry.

DETAILED DESCRIPTION OF THE INVENTION

Figure 1:
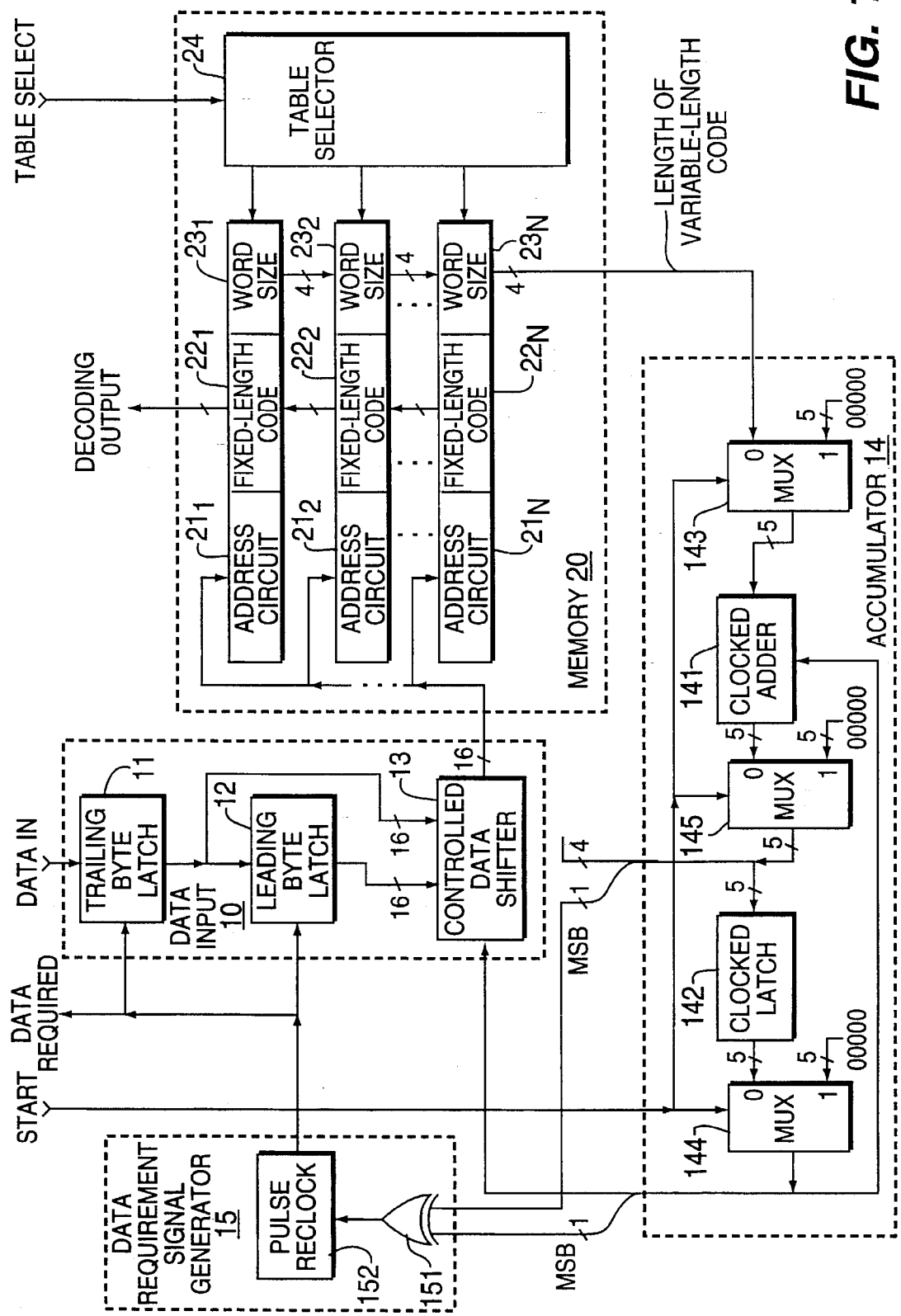
FIG. 1 is a block schematic of a decoder for variable-length codes, which VLC decoder embodies the invention.

The FIG. 1 decoder for variable-length codes (which for convenience will be referred to as Huffman codes) comprises a data input portion 10 for receiving variable-length-encoded data supplied to its input port from memory controlled by a host processor and supplying shifted variable-length-encoded data shifted to a position within a data window at its output port. The FIG. 1 decoder further comprises a memory portion 20 comprising a set of N address circuits $21_1$, $21_2$, ... $21_N$; a set of N submemories $22_1$, $22_2$, ... $22_N$ storing respective Huffman decode look up tables (LUT) classified according to the statistical characteristics of the data; and a further set of N submemories $23_1$, $23_2$, ... $23_N$, each for storing the bit-lengths of variable-length codes associated with the generation of respective ones of its addresses. Each of the address circuits $21_1$, $21_2$, ... $21_N$ responds to a number described by the bits in an output window of the data input portion 10 to generate parallel addressing for one of the submemories $22_1$, $22_2$, ... $22_N$ and for one of the submemories $23_1$, $23_2$, ... $23_N$, which two submemories have identification numbers with subscripts similar to that address circuit. The particular nature of the address circuits $21_1$, $21_2$, ... $21_N$ will be described further on in this specification, when FIGS. 5, 7, 8 and 9 are described. Any one of the submemories $22_1$, $22_2$, ... $22_N$ and the one of the submemories $23_1$, $23_2$, ... $23_N$ the respective identification numbers of which bear the same subscript are considered to be submemories of the same memory since their respective bit planes are all addressed in parallel.

The memory portion 20 still further comprises table selection circuitry 24 for selecting, according to a table selection signal supplied by the host processor, one of these memories $22_1$ & $23_1$, $22_2$ & $23_2$, ... $22_N$ & $23_N$ for reading, so as to decode Huffman coding according to a specific decoding table. The table selection circuitry 24 can be of a type using a multiplexer for selecting which of the outputs from the submemories $22_1$, $22_2$, ... $22_N$ to apply to an output bus for decoding results and using another multiplexer for selecting which of the outputs from the submemories $23_1$, $23_2$, ... $23_N$ to apply to an output bus for the bit-lengths of the variable-length codes associated with the generation of those decoding results. To conserve operating power, the table selection circuitry 24 preferably further includes switching for selectively powering only the one of the memories $22_1$ & $23_1$, $22_2$ & $23_2$, ... $22_N$ & $23_N$ selected for reading.

The data input portion 10 comprises cascaded 16-bit-wide first and second clocked latches 11 and 12, a controlled data shifter 13, an accumulator 14 and a data requirement signal generator 15. In response to a DATA REQUIRED signal it generates by procedures presently described, the data input portion 10 receives data in 16-bit-wide bytes from a preceding portion of the system not shown in FIG. 1, which preceding portion of the system typically is a first-in/first-out buffer memory. In response to the DATA REQUIRED signal, the first clocked latch 11 receives and stores the current 16-bit input data, and the second latch 12 receives and stores the 16-bit input data which was previously stored in the first latch 11. Together, the first and second clocked latches 11 and 12 provide a 32-bit-wide parallel-bit input signal to the controlled data shifter 13. This width is more than sufficient to span two of the longest bit-length code words if both words are in a favorable phasing. Despite an unfavorable phasing of longer bit-length code words, the data shifter 13 will always be supplied at least one complete variable-length word having its leading bit amongst the bits supplied from the output port of the second clocked latch 12. The controlled data shifter 13 has to be capable of shifting, to the most significant bit place of its output port, the leading bit of any variable-length word appearing in the byte supplied from the output port of the second clocked latch 12. That is, if the output port of the second clocked latch 12 supplies a 16-bit byte, the controlled data shifter 13 must be capable of up to a 15-bit shift towards greater significance. The input port of the controlled data shifter 13 must have a bit-width at least as wide as: the bit-width of the output port of the second clocked latch 12, plus one fewer than the longest bit-length of code words. The output port of the controlled data shifter 13 must have a bit-width at least as wide as the longest bit-length code words, so as to span an "output window" of the data input portion 10 having a bit-width equal to that longest bit-length and occupying the most significant bit positions of that output port. The controlled shift data shifter 13 is of the type known in the art that responds to a binary number B indicative of the number of desired bit places of shift in the direction towards increased significance, to cause the data supplied at its output port to correspond to data applied to portions of its input port positioned B bit places earlier than the portion of its input port aligned with its output port when the bit places B of shift is zero. Such a shifter is commonly referred to as a controlled "left" shifter, because the most significant bit of binary arithmetic is usually written to the left on paper to be viewed by humans. The controlled shift data shifter 13 can be constructed by pruning a conventional 16-bit barrel shifter that responds to a binary number B indicative of the number of desired bit places of rotation in the direction towards increased significance.

Figure 2:
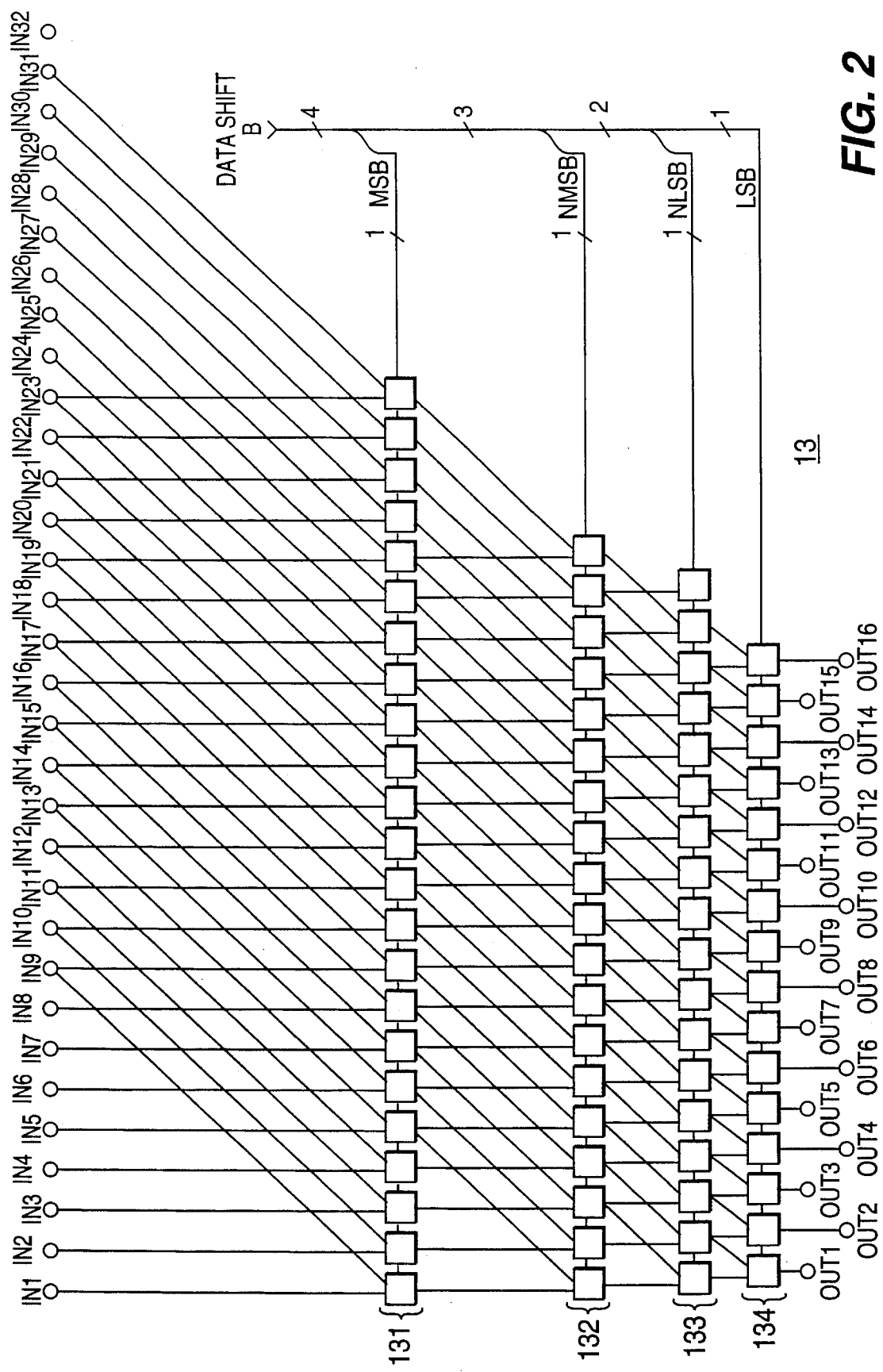
FIG. 2 is a block schematic of a data shifter as can be used in the FIG. 1 VLC decoder or variants thereof.

FIG. 2 shows the resulting structure. The most significant bit of the binary number B indicative of the number of desired bit places of shift in the direction towards increased significance controls a rank 131 of two-input multiplexers, 23 in number. Responsive to the most significant bit of B being a ZERO, the rank 131 of multiplexers selectively reproduce the 23 leading bits IN1–IN23 of the data shifter input signal as their output signal. Responsive to the most significant bit of B being a ONE, the rank 131 of multiplexers selectively reproduce the bits IN9–IN31 of the input signal as their output signal. The next to most significant bit of B controls a rank 132 of two-input multiplexers, 19 in number. Responsive to the next to most significant bit of B being a ZERO, the rank 132 of multiplexers selectively reproduce the single-bit outputs of the 19 leftmost multiplexers in the rank 131 as their output signal. Responsive to the next to most significant bit of B being a ONE, the rank 132 of multiplexers selectively reproduce the single-bit outputs of the 19 rightmost multiplexers in the rank 131 as their output signal. The next to least significant bit of B controls a rank 133 of two-input multiplexers, 17 in number. Responsive to the next to least significant bit of B being a ZERO, the rank 133 of multiplexers selectively reproduce the single-bit outputs of the 17 leftmost multiplexers in the rank 132 as their output signal. Responsive to the next to least significant bit of B being a ONE, the rank 133 of multiplexers selectively reproduce the single-bit outputs of the 19 rightmost multiplexers in the rank 132 as their output signal. The least significant bit of B controls a rank 134 of two-input multiplexers, 16 in number. Responsive to the least significant bit of B being a ZERO, the rank 134 of multiplexers selectively reproduce the single-bit outputs of the 16 leftmost multiplexers in the rank 133 as their respective single-bit outputs OUT1–OUT16 that provide the controlled data shifter 13 output signal. Responsive to the least significant bit of B being a ONE, the rank 134 of multiplexers selectively reproduce the single-bit outputs of the 16 rightmost multiplexers in the rank 133 to provide the controlled data shifter 13 output signal.

Referring back to FIG. 1, the accumulator 14 accumulates the bit-lengths of variable-length codes successively supplied to the FIG. 1 decoder during a time beginning after a START indication is supplied to the FIG. 1 decoder from a prefix code decoder not shown in FIG. 1. The accumulation in accumulator 14 is a modulo-32 accumulation, with the accumulation result indicating the number of bit places the data has to be shifted in order to advance the next variable-length code so its leading bit will occupy the most significant bit place in the output window of the data input portion 10. Change in the most significant bit of the accumulation result is sensed by the data requirement signal generator 15 as an indication that, rather than the leading bit of the next variable-length code tending to appear in one of the bit places of the output port of the second latch 12, that leading bit would tend to appear in one of the bit places of the output port of the first latch 11. This is undesirable since longer-bit-length code words may extend beyond the bits available at the output port of the first latch 11. Accordingly, the data requirement signal generator 15 generates the DATA REQUIRED signal responsive to change in the most significant bit of the accumulation result generated by the accumulator 14. This shifts a new 16-bit byte of data into the first latch 11 and advances the previous 16-bit byte of data into the second latch 12. The four least significant bits of the accumulation result generated by the accumulator 14 are applied to the controlled data shifter 13 as its control signal. These four least significant bits of the accumulation result specify the number of bit-places shift towards greater significance that is required for the controlled data shifter 13 to position the leading bit of the next variable-length code, which is now available from the output port of the second latch 12, into the most significant bit position of the output window of the data input portion 10.

More particularly, FIG. 1 shows the accumulator 14 comprising a clocked digital adder 141, clocked latch 142, and three double-input/single-output multiplexers 143, 144 and 145, each of which multiplexers receives a wired arithmetic zero at its respective first input connection. The output connections of the multiplexers 143 and 144 are to respective ones of the addend input connections of the clocked-input digital adder 141, and the output connection of the multiplexer 145 is to the input connection of the clocked latch 142. The second input connection of the multiplexer 143 receives, from the memory portion 20 of the FIG. 1 decoder, indications of the bit-lengths of variable-length codes that are successively supplied to the FIG. 1 decoder. The output connections of the clocked-input digital adder 141 and of the clocked latch 142 are respectively to the second input connection of the multiplexer 145 and to the second input connection of the multiplexer 144. The START signals supplied prior to the Huffman code strings condition the multiplexers 143, 144 and 145 to reset the output signals from the clocked-input digital adder 141 and of the clocked latch 142 both to modulo-32 zero, starting accumulation in the accumulator 14 from modulo-32 zero. Thereafter, the multiplexers 143, 144 and 145 connect the clocked-input digital adder 141 and of the clocked latch 142 for accumulation, with the sum output signal from the adder 141 being latched in the clocked latch 142 and fed back as a summand input signal to the adder 141 to have the bit-length of the next variable-length code accumulated therewith the next time the clocked-input digital adder 141 receives CLOCK input signal.

This arrangement of the accumulator 14 simplifies the construction of the data requirement signal generator 15. A two-input exclusive-OR gate 151 in the data requirement signal generator 15 receives the respective most significant bits of the output signals from the multiplexers 145 and 144 in the accumulator 14. Except when START signal is supplied, the multiplexers 145 and 144 supply the respective most significant bits of the output signals of the adder 141 and of the latch 142 to the exclusive-OR gate 15. The clocking of the clocked latch 142 lags that of the clocked-input digital adder 141, so the exclusive-OR gate 151 compares the most significant bit of the previous output signal of the adder 141 latched in the latch 142 with the most significant bit of the updated output signal of the adder 141 to signal change in the most significant bit of the accumulation result generated by the accumulator 14. The exclusive-OR gate 151 generates a logic ONE whenever there is a change in that most significant bit, which can be used directly as DATA REQUIRED signal or can as shown in FIG. 1 be supplied to pulse reclocking circuitry to generate DATA REQUIRED signal.

Figure 3:
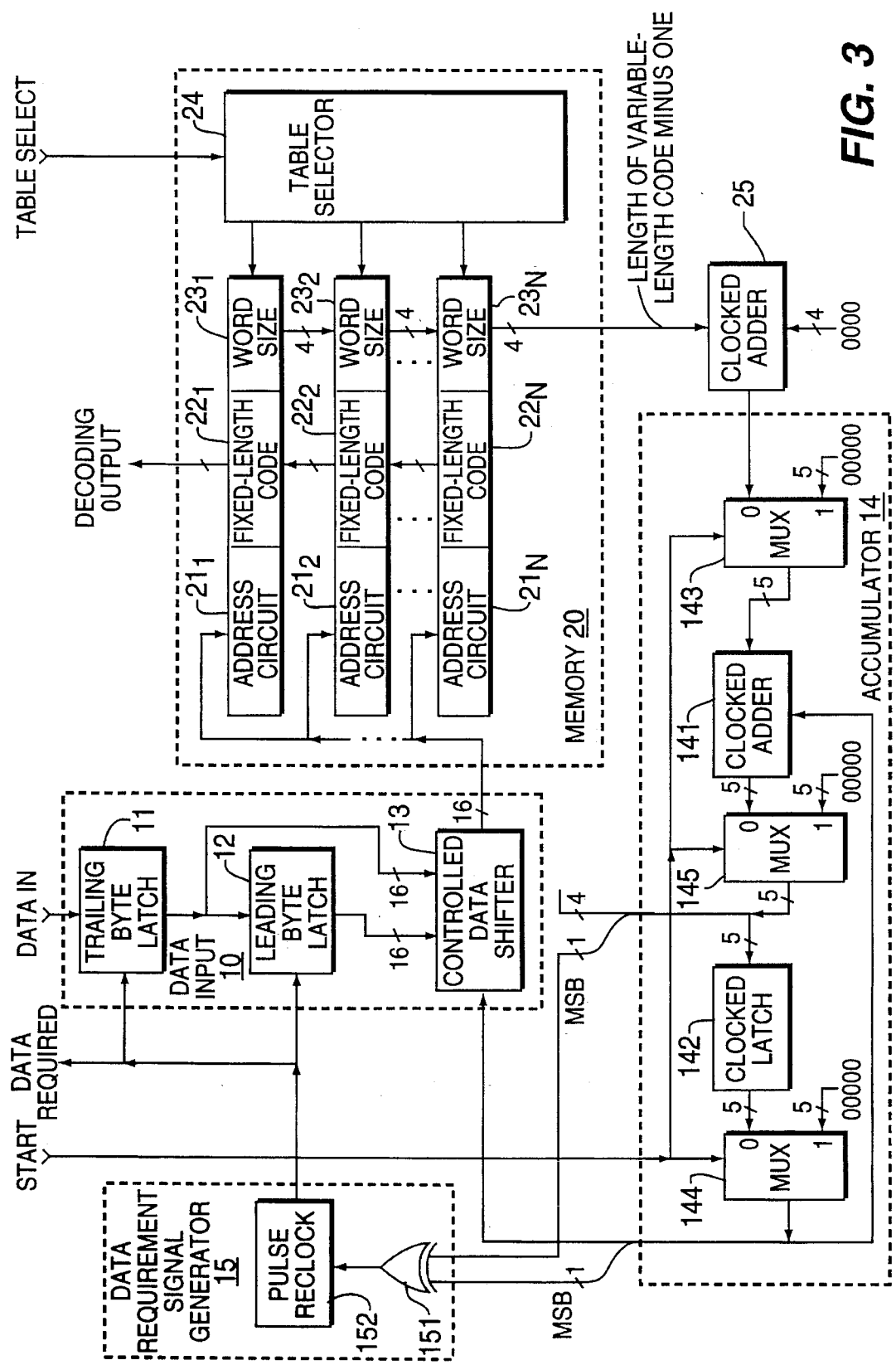
FIG. 3 is a block schematic of a VLC decoder which is a variant of the FIG. 1 VLC decoder and also embodies the invention.

FIG. 3 shows a modification of the FIG. 1 VLC decoder that reduces the number of bit places in the submemories $23_1$, $23_2$, . . . $23_N$ when occasionally using 16-bit-long Huffman codes, which can be accommodated by the data input portion 10. Every Huffman code is at least one bit long. Storing the difference of Huffman code bit length from one bit in the submemories $23_1$, $23_2$, . . . $23_N$ facilitates the storage of indications of code bit-lengths in four, rather than, five bit places when 16-bit-long Huffman codes are used. A clocked-input digital adder 25 adds arithmetic one to the indications of code bit-lengths furnished by the currently enabled one of the submemories $23_1$, $23_2$, . . . $23_N$ and supplies the resulting sum, which is the actual bit-length of the Huffman code, to the accumulator 14.

An alternative scheme stores "0000" as the indication of code bit-length for 16-bit-long Huffman codes to allow the storage of indications of code bit-lengths in four bit places. A decoder responds to the indications of code bit-lengths for extending those indications by one additional bit in the direction of increased significance. The bit extension is "1" when a "0000" indication of code bit-length is decoded and is otherwise "0".

FIG. 4 shows a representative Huffman decoding table as might be stored in one of the submemories $22_1$, $22_2$, . . . $22_N$. This decoding table will be referred to in describing how, in accordance with the invention, the amount of memory is reduced in the one of the memories $22_1$ & $23_1$, $22_2$ & $23_2$, . . . $22_N$ & $23_N$ used for storing this Huffman decoding table. FIG. 4 shows the representative Huffman decoding table partition into addressing subranges, as used in an address circuit $21_X$ shown in FIG. 5.

Figure 5:
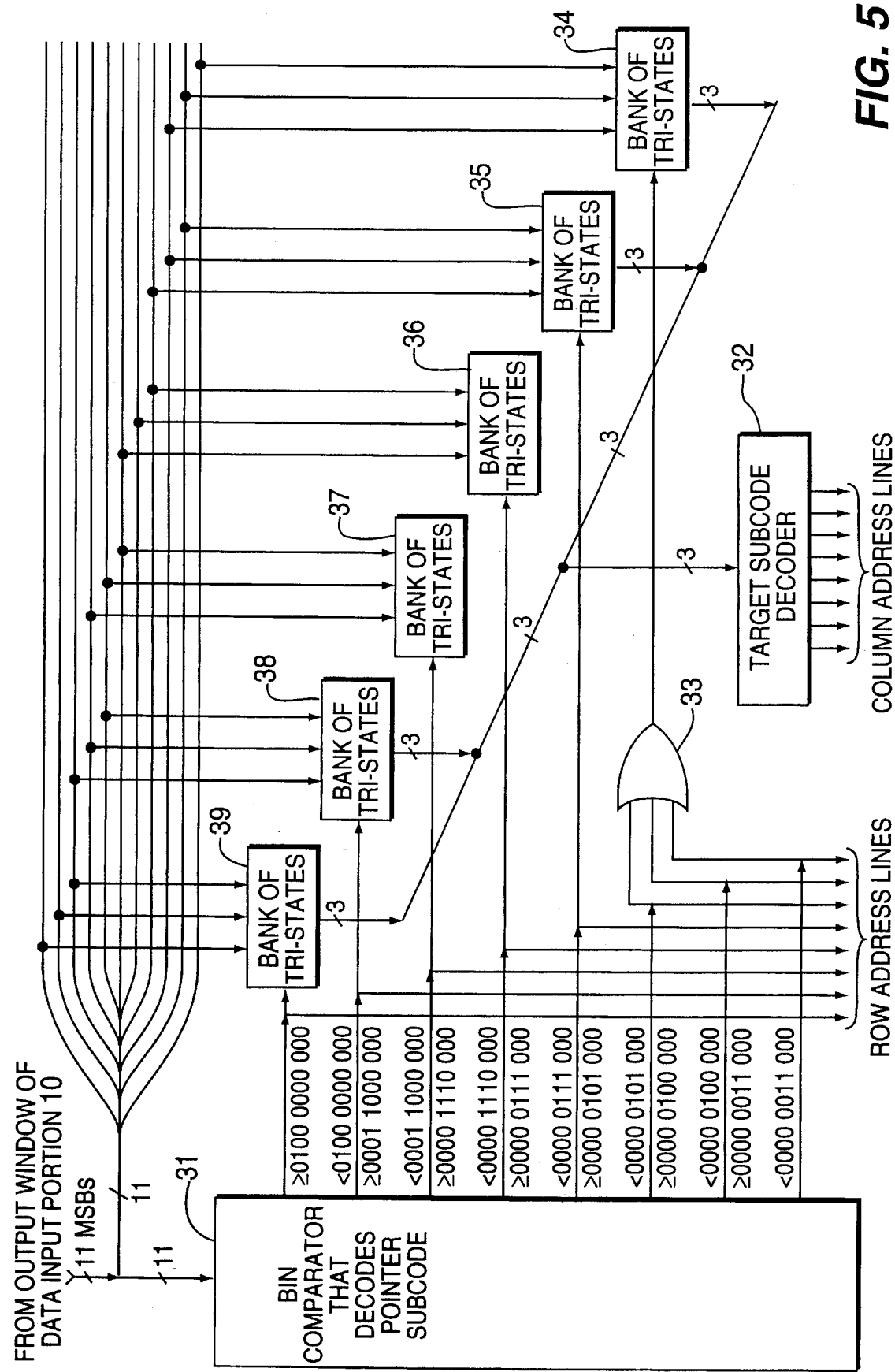
FIG. 5 is a block schematic of the address circuitry for memory storing the FIG. 4 Huffman decoding table in a decoder for variable-length codes as shown in FIG. 1 or as shown in FIG. 3.

FIG. 5 shows the address circuit $21_X$ for the submemory $22_X$ the addressed storage locations of which store the decoding results of the FIG. 4 Huffman decoding table and for the submemory $23_X$ the addressed storage locations of which store the bit-lengths of the variable-length codes giving rise to the decoding results in the correspondingly addressed storage locations of the submemory $22_X$. The address circuit $21_X$ is one of the address circuits $21_1$, $21_2$, . . . $21_N$; the submemory $22_X$ is one of the submemories $22_1$, $22_2$, . . . $22_N$; and the submemory $23_X$ is one of the submemories $23_1$, $23_2$, . . . $23_N$.

The eleven most significant bits from the controlled data shifter 13 of FIG. 1 are applied as input bits to a bin comparator 31 in FIG. 5. The bin comparator 31 is used to divide the address range described by these eleven bits into subranges according to the location of the target portion of the variable-length codes described by the more significant ones of these bits. A certain number of bits are presumed for the fixed-length target subcodes contained either in the final portions of the variable-length codes or in the final portions of the variable-length codes extended to include one bit or a few bits of no significance to decoding. Trial designs for alternative presumptions of the number of bits in the fixed-length target subcodes can be made and compared to determine the final design resulting in the greatest hardware economy. These comparisons are preferably made on a global basis, taking into account the hardware in all the address circuits $21_1$, $21_2$, . . . $21_N$, since these address circuits can often share some hardware. In the instance of the FIG. 4 Huffman decoding table, a fixed-length target subcode three bits wide is optimal.

In FIG. 5 the address range for the 11-bit-wide output window from the output port of the data input portion 10 of FIG. 1 is divided into eight subranges when the fixed-length target subcode is considered to be three bits wide. The bin comparator 31 has a respective bin output connection for each subrange, which eight bin output connections control eight memory address lines. A 3-bit target subcode is a binary code that, when decoded by a target subcode decoder 32, controls eight additional memory address lines. An OR gate 33 and the banks 34–39 of tri-states together comprise a multiplexer that is responsive to the pointer subcode decoded by the bin comparator 31. This multiplexer selects, from the output port of the data input portion 10 of FIG. 1, a target subcode for application to the three input connections of the target subcode decoder 32. Assuming the submemory $22_X$ and the submemory $23_X$ are addressed in two dimensions, the eight bin output connections of the bin comparator 31 can supply the storage locations of these submemories with row addressing, and the eight outputs of the target subcode decoder 32 can supply the storage locations of these submemories with row addressing.

The division of the address range for the 11-bit-wide output window into eight subranges is done by analyzing the FIG. 4 Huffman decoding table as follows. Scanning the variable-bit codes from the bottom of the FIG. 4 table up, after codes "0000 0001 000" and "0000 0001 111", the three-bit target subcode "000" within code "0000 0001 000" repeats within code "0000 0011 000". Accordingly, codes "0000 0001 000" and "0000 0001 111" are in a first subrange of the address range for the 11-bit-wide output window from the output port of the data input portion 10. The bin comparator 31 accordingly has a first bin output connection that supplies an output signal that is logic ONE for output window values less than "0000 0011 000". Continuing the upward scan of the variable-bit codes of the FIG. 4 table, the three-bit target subcode "000" within code "0000 0011 000"

repeats within code "0000 0100 000". Accordingly, codes "0000 0011 000", "0000 0011 001", "0000 0011 010", "0000 0011 011", "0000 0011 100", "0000 0011 101", "0000 0011 110", and "0000 0011 111" are in a second subrange of the address range. The bin comparator 31 accordingly has a second bin output connection that supplies an output signal that is logic ONE for output window values at least "0000 0011 0000", but less than "0000 0100 000". Continuing the upward scan of the variable-bit codes of the FIG. 4 table, the three-bit target subcode "000" within code "0000 0100 000" repeats within the one-bit-extended code "0000 0101 000", when the code "0000 0101 00" is followed by a variable-length code other than "1". A third subrange of the address range includes the codes "0000 0100 000", "0000 0100 001", "0000 0100 010", "0000 0100 011", "0000 0100 10", and "0000 0100 11". The bin comparator 31 accordingly has a third bin output connection that supplies an output signal that is logic ONE for output window values at least "0000 0100 000", but less than "0000 0101 000". The three-bit target subcode for each of the first, second and third subranges uses the ninth, tenth and eleventh bit places of the shifted data from the data input portion 10. A ONE supplied from any of the first, second and third bin output connections of the bin comparator 31 is a pointer indicating that the three-bit target subcode is located in the ninth, tenth and eleventh bit places of the data input portion 10 output window. The 3-input OR gate 33 with respective input connections from the first, second and third bin output connections of the bin comparator 31 responds to any of these ONEs to condition the bank 34 of tri-states to apply from low source impedances the ninth, tenth and eleventh bit places of the shifted data from the data input portion 10 to the three input connections of the target subcode decoder 32.

In the next, fourth subrange of the address range for the 11-bit-wide output window from the output port of the data input portion 10, the bank 35 of tri-states will selectively apply the eighth, ninth, and tenth bit places of the shifted data from the data input portion 10 with low source impedances to the three input connections of the target subcode decoder 32. To define the extent of this fourth subrange, the upward scan of the variable-bit codes of the FIG. 4 table is continued, progressing upward from the code "0000 0101 00" in which the three-bit target subcode is "100". This three-bit target subcode of "100" repeats within the two-bit-extended code "0000 0111 00", when the code "0000 0111" is followed by a variable-length code other than "1", "011" or "010". Accordingly, codes "0000 0101 00", "0000 0101 01", "0000 0101 10", "0000 0101 11", and "0000 0110" are in the fourth subrange. The bin comparator 31 accordingly has a fourth bin output connection that supplies an output signal that is logic ONE for output window values at least "0000 0101 000", but less than "0000 0111 000". A ONE supplied from the fourth bin output connection of the bin comparator 31 is a pointer indicating that the three-bit target subcode is located in the eighth, ninth, and tenth bit places of the data input portion 10 output window and conditions the bank 35 of tri-states to selectively apply these bit places from low source impedances to the three input connections of the target subcode decoder 32.

In the next, fifth subrange of the address range for the 11-bit-wide output window from the output port of the data input portion 10, the bank 36 of tri-states will selectively apply the sixth, seventh, and eighth bit places of the shifted data from the data input portion 10 with low source impedances to the three input connections of the target subcode decoder 32. To define the extent of this fifth subrange, the upward scan of the variable-bit codes of the FIG. 4 table is continued, progressing upward from the code "0000 0111" in which the three-bit target subcode is "111". This three-bit target subcode of "111" repeats within the two-bit-extended code "0000 1111", when the code "0000 111" is followed by the variable-length code "1". Accordingly, codes "0000 0111", "0000 1000", "0000 1001", "0000 1010", "0000 1011", and "0000 110" are in the fifth subrange. The bin comparator 31 accordingly has a fifth bin output connection that supplies an output signal that is logic ONE for output window values at least "0000 0111 000", but less than "0000 1110 000". A ONE supplied from the fifth bin output connection of the bin comparator 31 is a pointer indicating that the three-bit target subcode is located in the sixth, seventh, and eighth bit places of the data input portion 10 output window and conditions the bank 36 of tri-states to selectively apply these bit places from low source impedances to the three input connections of the target subcode decoder 32.

In the next, sixth subrange of the address range for the 11-bit-wide output window from the output port of the data input portion 10, the bank 37 of tri-states will selectively apply the fifth, sixth, and seventh bit places of the shifted data from the data input portion 10 with low source impedances to the three input connections of the target subcode decoder 32. To define the extent of this sixth subrange the upward scan of the variable-bit codes of the FIG. 4 table is continued, progressing upward from the code "0000 111" in which the three-bit target subcode is "111". This three-bit target subcode of "111" repeats within the two-bit-extended code "0001 111", when the code "0001 1" is followed by two variable-length codes "1". Accordingly, codes "0000 111" and "0001 0" are in the sixth subrange. The bin comparator 31 accordingly has a sixth bin output connection that supplies an output signal that is logic ONE for output window values at least "0000 1110 000", but less than "0001 1000 000". A ONE supplied from the sixth bin output connection of the bin comparator 31 is a pointer indicating that the three-bit target subcode is located in the fifth, sixth, and seventh bit places of the data input portion 10 output window and conditions the bank 37 of tri-states to selectively apply these bit places from low source impedances to the three input connections of the target subcode decoder 32.

In the next, seventh subrange of the address range for the 11-bit-wide output window from the output port of the data input portion 10, the bank 38 of tri-states will selectively apply the third, fourth, and fifth bit places of the shifted data from the data input portion 10 with low source impedances to the three input connections of the target subcode decoder 32. To define the extent of this seventh subrange, the upward scan of the variable-bit codes of the FIG. 4 table is continued, progressing upward from the code "0001 1" in which the three-bit target subcode is "011". This three-bit target subcode of "011" repeats within the two-bit-extended code "0101 1", when the code "010" is followed by two variable-length codes "1". Accordingly, codes "0001 1", "0010", and "0011" are in the seventh subrange. The bin comparator 31 accordingly has a seventh bin output connection that supplies an output signal that is logic ONE for output window values at least "0001 1000 000", but less than "0100 0000 000". A ONE supplied from the seventh bin output connection of the bin comparator 31 is a pointer indicating that the three-bit target subcode is located in the third, fourth, and fifth bit places of the data input portion 10 output window and conditions the bank 38 of tri-states to selectively apply these bit places from low source impedances to the three input connections of the target subcode decoder 32.

In the next, eighth subrange of the address range for the 11-bit-wide output window from the output port of the data input portion 10, the bank 39 of tri-states will selectively apply the first, second, and third bit places of the shifted data from the data input portion 10 with low source impedances to the three input connections of the target subcode decoder 32. To define the extent of this eighth subrange, the upward scan of the variable-bit codes of the FIG. 4 table is continued, progressing upward from the code "010" in which the three-bit target subcode is "010". This three-bit target subcode of "010" is never repeated in the upward scanning of the codes so the eighth subrange is the final subrange of the address range for the 11-bit-wide output window from the output port of the data input portion 10. The codes "010", "011", and "1" are in the eighth and final subrange. The bin comparator 31 accordingly has an eighth bin output connection that supplies an output signal that is logic ONE for output window values at least "010 0000 000". A ONE supplied from the eighth bin output connection of the bin comparator 31 is a pointer indicating that the three-bit target subcode is located in the first, second, and third bit places of the data input portion 10 output window and conditions the bank 39 of tri-states to selectively apply these bit places from low source impedances to the three input connections of the target subcode decoder 32.

The design procedure for the bin comparator is slightly different when the Huffman codes are expressed in a form usually having leading ONEs rather than leading ZEROs; the extended codes decrease, rather than increase, in value in each successive addressing subrange so bin boundaries for the bin comparator are expressed in reverse order.

The design procedure for the bin comparator and its variant described above will always result in the least number of bins in the bin comparator for any given codeset. When some modification of the codeset is possible, this design procedure or its variant helps to improve the design of the codeset. The general strategy to improve code design is to have the target subcode repeat as infrequently as possible, to increase the number of codes in each addressing subrange as much as possible. If the Huffman codeset in the FIG. 4 table is modified, so the code for 35 (macroblock escape) is "0000 0001 110" rather than "0000 0001 000", during upward scan of the Huffman codes the target subcode "110" does not repeat until the code "0000 0011 110" is reached. When a first addressing subrange of eight codes through "0000 0011 101" is completed, a second addressing subrange of seven codes "0000 0011 110" through "0000 0100 10" is completed before the target subcode "110" repeats when the zero-extended code "0000 0100 11" is reached. The target subcode "011" in the code "0000 0100 11" is not repeated until the twice-one-extended code "0000 0100" is reached, so a third addressing subrange of six codes beginning with the code "0000 0100 11" and finishing with the code "0000 0101 11" is possible. The first through third addressing subranges made possible by using "0000 0001 110" as the code for 35 (macroblock escape) span the same number of codes as the first through fourth addressing subranges when using "0000 0001 000" as the code for 35 (macroblock escape), it is noted. Reduction of the number of addressing subranges by one saves one address line out of sixteen, which is almost a 7% saving in the memory size required for a 35-member Huffman codeset with a maximum bit-width of 11.

In practice it is often desirable to alter the addressing subranges slightly from those determined by the above-described design procedure for the bin comparator. This may be done to simplify the bin comparator hardware, for example. It is sometimes preferable to decode the shorter Huffman codes by a different approach. For example, the shorter Huffman codes can be decoded directly, using the decoding ONEs to impose corresponding decoding results, applied as wired inputs to banks of tri-states, on the output lines from the memory portion 20 of the variable-length-code decoder. Adjustment of the addressing subranges to most efficiently utilize the memory used in decoding the longer Huffman codes may then be desirable. In VLC decoders using plural memories $22_1$ & $23_1$, $22_2$ & $23_2$, ... $22_N$ & $23_N$ to store a plurality of Huffman decoding look-up tables these memories may be able to use addressing hardware in common; and adjustment of the addressing subranges of the respective bin decoders in the addressing circuits of these memories may permit more shared hardware to reduce overall hardware requirements. In some instances two or more of the submemories $23_1$, $23_2$, ... $23_N$ may be addressed by the same addressing hardware and store similar code bit-length information; in such case the similar submemories can be replaced by a single shared submemory.

Figure 7:
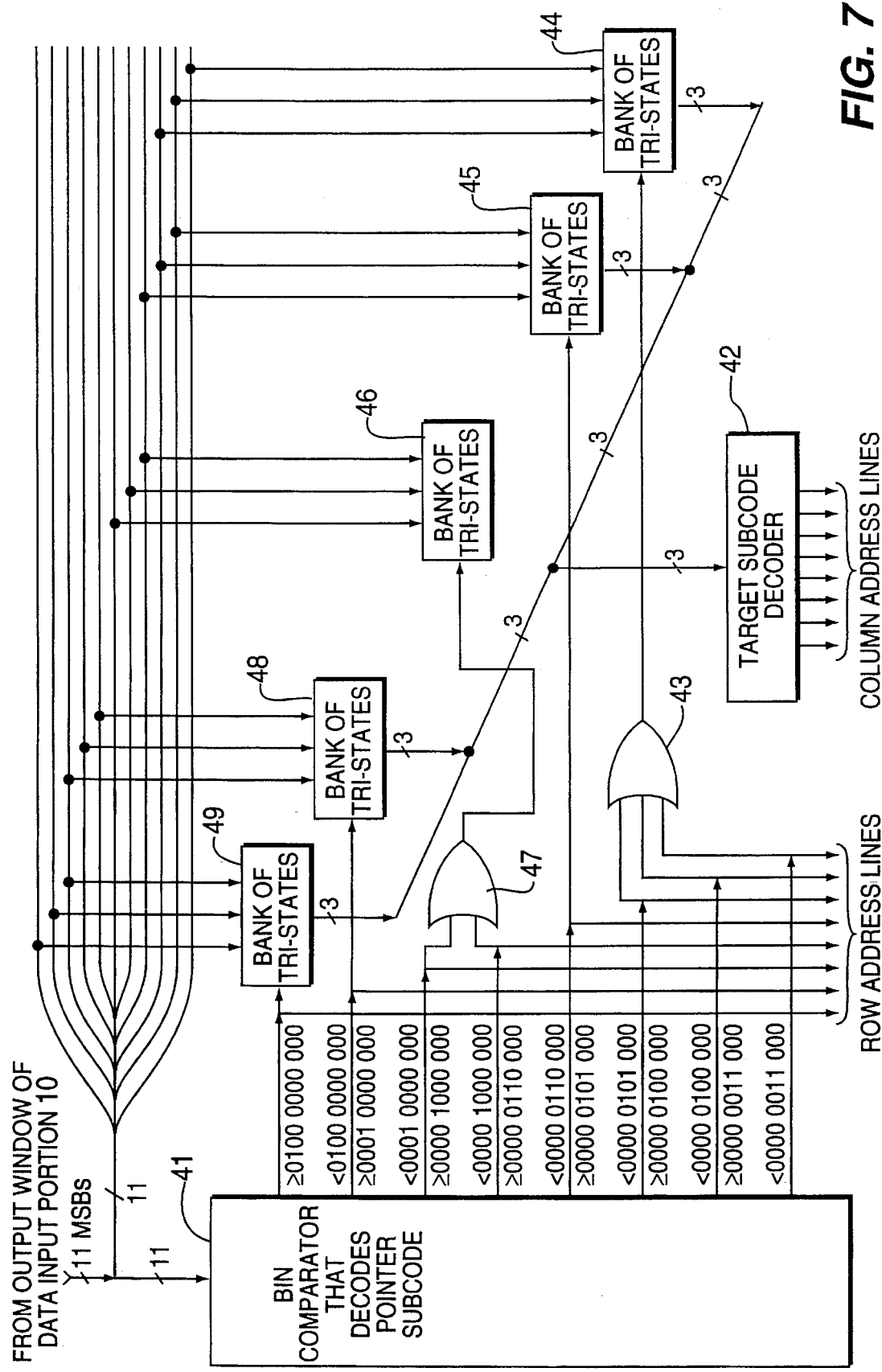
FIG. 7 is a block schematic of the modified address circuitry for memory storing the FIG. 6 Huffman decoding table in a decoder for variable-length codes as shown in FIG. 1 or as shown in FIG. 3.

FIG. 6 shows an alternative partitioning of the same Huffman code table as shown in FIG. 4, and FIG. 7 shows the modification of the FIG. 5 address circuit $21_X$ in which modified address circuit the bin comparator 31 is replaced by a bin comparator 41 with different bins. A target subcode decoder 42 and an OR gate 43 in the modified address circuit of FIG. 7 correspond to the target subcode decoder 32 and the OR gate 33 in the FIG. 5 address circuit $21_X$. Banks 44, 45, 46, 48 and 49 of tri-states in the modified address circuit of FIG. 7 correspond to the banks 34, 35, 36, 38 and 39 of tri-states in the FIG. 5 address circuit $21_X$. The bank 46 of tri-states in the modified address circuit of FIG. 7 also replaces the bank 37 of tri-states in the FIG. 5 address circuit $21_X$, and an OR gate 47 responds either to a ONE supplied as fifth bin response by the bin comparator 41 responsive to Huffman codes in the fifth addressing subrange, or to a ONE supplied as sixth bin response by the bin comparator 41 responsive to Huffman codes in the sixth addressing subrange. OR gates 43 and 47 combine with the banks 44, 45, 46, 48 and 49 of tri-states to form a multiplexer that responds to the pointer subcode, as decoded by the bin comparator 41, for selecting a target subcode from the output port of the data input portion 10 of FIG. 1 for application to the target subcode decoder 42.

Figure 8:
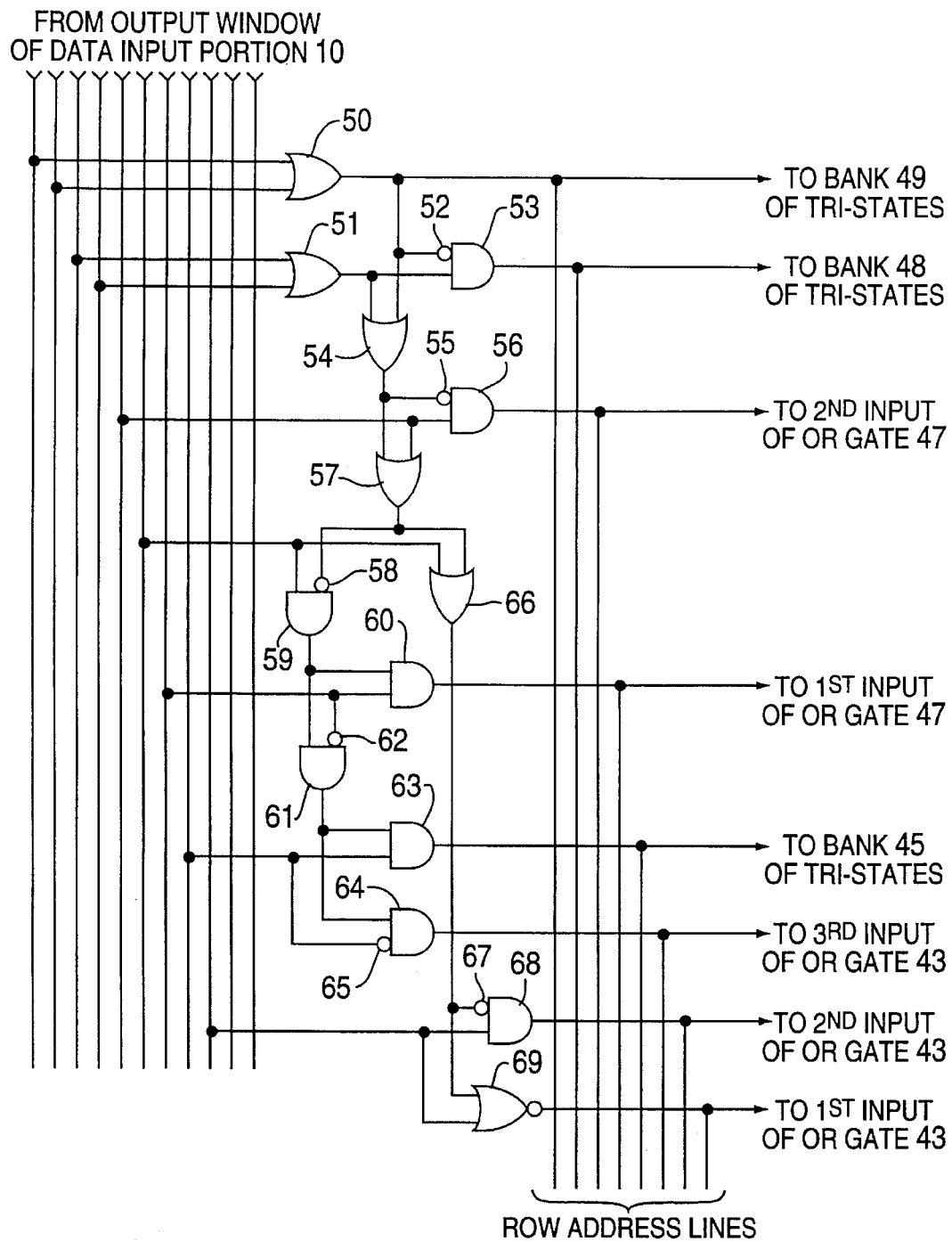
FIG. 8 is a block schematic of address decoding circuitry for replacing a bin comparator in the modified address circuitry of FIG. 7.

FIG. 8 shows simple address decoder elements that can replace the bin comparator 41. An two-input OR gate 50 responds to either of the first and second leadmost bits of the 11-bit-wide output window from the output port of the data input portion 10 being a ONE to supply a ONE indicating that the Huffman code is in the eighth addressing subrange. The output of the OR gate 50 drives the row address line selected by Huffman codes in the eighth addressing subrange. A ONE supplied from the OR gate 50 is a pointer indicating that the three-bit target code is located in the first, second, and third bit places of the data input portion 10 output window and conditions the bank 49 of tri-states to selectively apply these bit places from low source impedances to the three input connections of the target code decoder 42.

A two-input OR gate 51 responds to either of the first and second leadmost bits of the 11-bit-wide output window from the output port of the data input portion 10 being a ONE to supply a ONE. The OR gate 50 response is complemented by NOT gate 52 for generating a NOR response to the first and second leadmost bits of the 11-bit-wide output window from the output port of the data input portion 10, which NOR response is applied as a first input signal to a two-input AND gate 53 that receives the OR gate 51 response as a second input signal. Accordingly, the AND gate 53 responds to a ZERO from the OR gate 50 concurring with a ONE from the OR gate 51 to supply a ONE indicating that the Huffman code is in the seventh addressing subrange. The output of the AND gate 53 drives the row address line selected by Huffman codes in the seventh addressing subrange. A ONE supplied from the AND gate 53 is a pointer indicating that the three-bit target subcode is located in the third, fourth, and fifth bit places of the data input portion 10 output window and conditions the bank 48 of tri-states to selectively apply these bit places from low source impedances to the three input connections of the target subcode decoder 42.

A two-input OR gate 54 responds to either of the responses from OR gates 50 and 51 being a ONE to generate a ONE. A NOT gate 55 complements the OR gate 54 response to generate a NOR response to the first, second, third and fourth leadmost bits of the 11-bit-wide output window from the output port of the data input portion 10, which NOR response is applied as a first input signal to a two-input AND gate 56. As its second input signal, the AND gate 56 receives the fifth leadmost bit from the data input portion 10 output window. The output of the AND gate 56 drives the row address line selected by Huffman codes in the sixth addressing subrange. A ONE supplied from the AND gate 53 is a pointer indicating that the three-bit target subcode is located in the sixth, seventh, and eighth bit places of the data input portion 10 output window and is supplied to the OR gate 47 of FIG. 7. The OR gate 47 applies a ONE response to the bank 46 of tri-states to condition them for selectively applying these sixth, seventh, and eighth bit places of the data input portion 10 output window from low source impedances to the three input connections of the target subcode decoder 42.

A two-input OR gate 57 responds to the response from the OR gate 54 or the fifth leadmost bit from the data input portion 10 output window being a ONE to generate a ONE. A NOT gate 58 complements the OR gate 57 response to generate a NOR response to the first, second, third, fourth and fifth leadmost bits of the 11-bit-wide output window from the output port of the data input portion 10, which NOR response is applied as a first input signal to a two-input AND gate 59. As its second input signal, the AND gate 59 receives the sixth leadmost bit from the data input portion 10 output window. The response of the AND gate 59 is supplied as the respective first input signals of the two-input AND gates 60 and 61. As their respective second input signals, the AND gates 60 and 61 receive the seventh leadmost bit from the data input portion 10 output window and its logic complement, respectively. A NOT gate 62 responds to that seventh leadmost bit to generate its logic complement.

The AND gate 60 drives the row address line selected by Huffman codes in the fifth addressing subrange. A ONE supplied from the AND gate 60 is a pointer indicating that the three-bit target subcode is located in the sixth, seventh, and eighth bit places of the data input portion 10 output window and is supplied to the OR gate 47 of FIG. 7. The OR gate 47 applies a ONE response to the bank 46 of tri-states to condition them for selectively applying these sixth, seventh, and eighth bit places of the data input portion 10 output window from low source impedances to the three input connections of the target subcode decoder 42.

The response of the AND gate 61 is supplied as the respective first input signals of the two-input AND gates 63 and 64. As their respective second input signals, the AND gates 63 and 64 receive the eighth leadmost bit from the data input portion 10 output window and its logic complement, respectively. A NOT gate 65 responds to that eighth leadmost bit to generate its logic complement.

The AND gate 63 drives the row address line selected by Huffman codes in the fourth addressing subrange. A ONE supplied from the AND gate 63 is a pointer indicating that the three-bit target subcode is located in the eighth, ninth, and tenth bit places of the data input portion 10 output window and is supplied to the bank 45 of tri-states to condition them for selectively applying these bit places of the data input portion 10 output window from low source impedances to the three input connections of the target subcode decoder 42.

The AND gate 64 drives the row address line selected by Huffman codes in the third addressing subrange. A ONE supplied from the AND gate 64 is a pointer indicating that the three-bit target subcode is located in the ninth, tenth, and eleventh bit places of the data input portion 10 output window and is supplied to the OR gate 43 of FIG. 7. The OR gate 43 applies a ONE response to the bank 44 of tri-states to condition them for selectively applying these ninth, tenth, and eleventh bit places of the data input portion 10 output window from low source impedances to the three input connections of the target subcode decoder 42.

A two-input OR gate 66 responds to the response from the OR gate 57 or the sixth leadmost bit from the data input portion 10 output window being a ONE to generate a ONE. A NOT gate 67 complements the OR gate 65 response to generate a NOR response to the first, second, third, fourth, fifth and sixth leadmost bits of the 11-bit-wide output window from the output port of the data input portion 10, which NOR response is applied as a first input signal to a two-input AND gate 68. As its second input signal, the AND gate 68 receives the seventh leadmost bit from the data input portion 10 output window. The AND gate 68 drives the row address line selected by Huffman codes in the second addressing subrange. A ONE supplied from the AND gate 68 is another pointer indicating that the three-bit target subcode is located in the ninth, tenth, and eleventh bit places of the data input portion 10 output window and is supplied to the OR gate 43 of FIG. 7. The OR gate 43 applies a ONE response to the bank 44 of tri-states to condition them for selectively applying these ninth, tenth, and eleventh bit places of the data input portion 10 output window from low source impedances to the three input connections of the target subcode decoder 42.

A two-input NOR gate 69 responds to the response from the OR gate 57 and the seventh leadmost bit from the data input portion 10 output window both being ZEROs to generate a ONE. The response of the NOR gate 69 is a NOR response to the first, second, third, fourth, fifth, sixth and seventh leadmost bits of the 11-bit-wide output window from the output port of the data input portion 10. The NOR gate 69 drives the row address line selected by Huffman codes in the first addressing subrange. A ONE supplied from the NOR gate 69 is still another pointer indicating that the three-bit target subcode is located in the ninth, tenth, and eleventh bit places of the data input portion 10 output window and is supplied to the OR gate 43 of FIG. 7. The OR gate 43 applies a ONE response to the bank 44 of tri-states to condition them for selectively applying these ninth, tenth, and eleventh bit places of the data input portion 10 output window from low source impedances to the three input connections of the target subcode decoder 42.

In the claims following this application the term "bin comparator" is to be construed to include decoding arrangements using logic elements of the same general nature as the decoding arrangement shown in FIG. 8, as well as bin comparators operating in accordance with arithmetic procedures. A bin comparator operating in accordance with two's complement arithmetic procedures can be constructed in which, for each bin, the code is subtracted from the lower boundary of the bin to generate a first difference for that bin, the upper boundary of the bin is subtracted from the code to generate a second difference for that bin, and a two-input AND gate logically ANDs the sign bits for the first and second differences to generate a ONE if and only if the code is between the lower and upper boundaries of the bin. A skilled digital designer will understand some reduction is often possible in the circuitry comprising the bin comparator and external gating circuitry. For example, the sign bit from the difference output signal of the subtractor, that is included in the bin comparator 41 of FIG. 7 for determining whether the 11-bit binary number in the output window of the data input portion 10 is less than "0000 0101 000", can be used for controlling the bank 44 of tri-states, so the OR gate 43 can be dispensed with.

Figure 9:
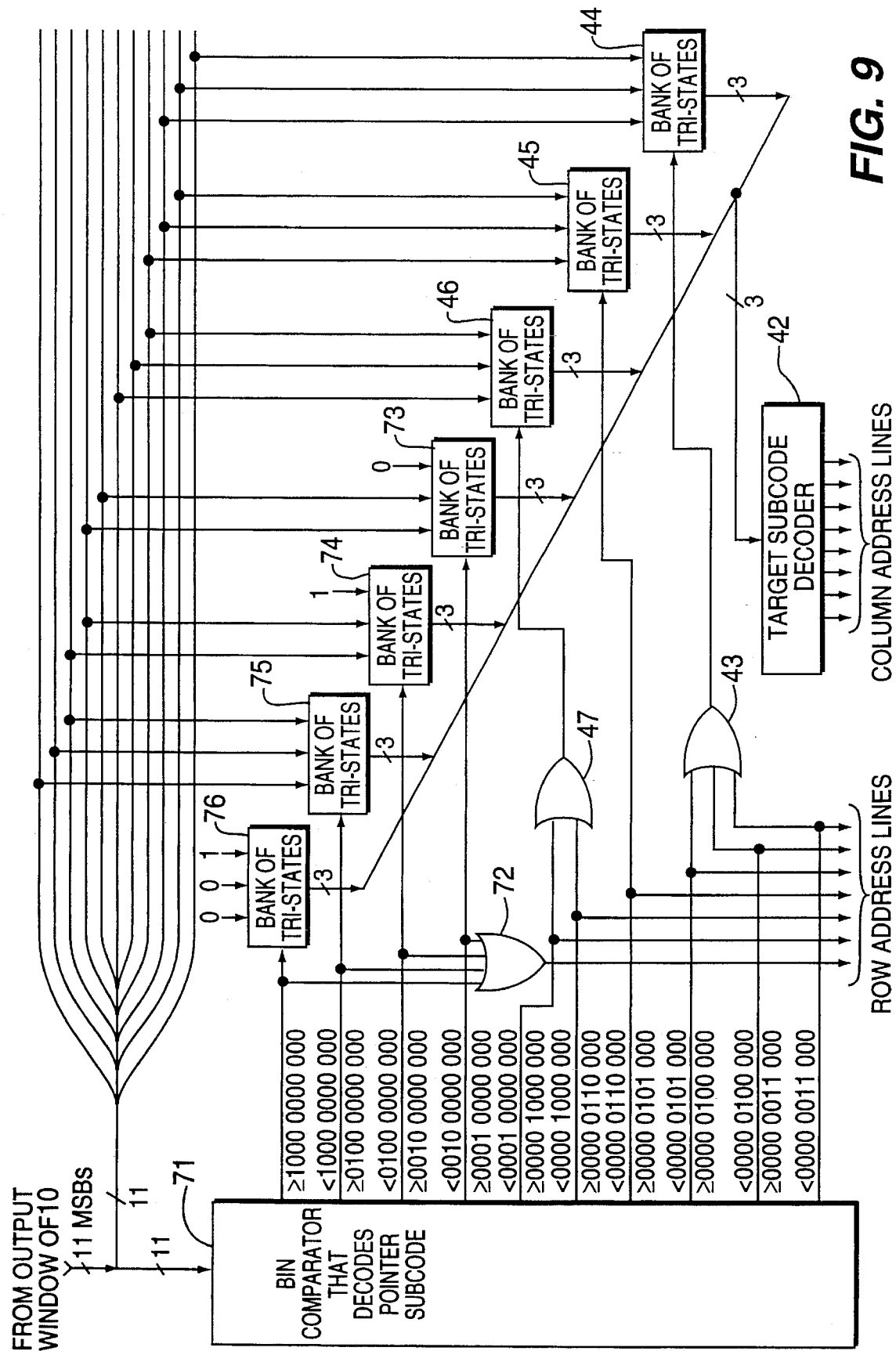
FIG. 9 is a block schematic illustrative of modifications that can be made to the address decoding circuitry of FIG. 7 to achieve further reduction in memory.

One skilled in the art of VLC design using look-up table memory will be enabled by acquaintance with the foregoing disclosure to design certain modifications of the VLC decoders as thus far described, which perform the similar ultimate decoding functions and are within the spirit and scope of the claims appended to this specification. By way of example, FIG. 9 shows modifications that can be made to the addressing circuitry of FIG. 7 to reduce the number of address lines. The FIG. 9 modification replaces the bin decoder 41 of FIG. 7 with a bin decoder 71 having the same first through sixth bin responses as the bin decoder 41. However, to provide its seventh and eighth bin responses, the bin decoder 71 subdivides the seventh bin response of the bin decoder 41; and to provide its ninth and tenth bin responses, the bin decoder 71 subdivides the eighth bin response of the bin decoder 41. A 4-input OR gate 72 in the FIG. 9 modification ORs the seventh, eighth, ninth, and tenth bin responses of the bin decoder 71 to drive a single address line, rather than the seventh and eighth bin responses of the bin decoder 41 being used to drive two address lines.

The FIG. 9 modification decodes the codes "1", "011", "010", "0011", "0010", "0001 1", and "0001 0" to a single address line rather than two address lines. This modification requires that the target code be generated somewhat differently for the shorter-bit-length Huffman codes. In the FIG. 9 modification the banks 48 and 49 of tri-states are dispensed with in the multiplexer used for selecting target codes to the target subcode decoder 42; and banks 73, 74, 75 and 76 of tri-states are used instead in the multiplexer, together with the OR gates 43, 47 and the banks 44, 45, 46 of tri-states.

Output window values from the output port of the data input portion 10 that are supplied to the bin decoder 71 and that are at least "0000 1000 000", but less than "0001 0000 000", are within the seventh addressing subrange of the bin decoder 71 and cause its otherwise-ZERO seventh bin response to be ONE. A ONE supplied from the seventh bin output connection of the bin comparator 71 conditions the bank 73 of tri-states to selectively apply the fourth leadmost bit of the output window value, the fifth leadmost bit of the output window value, and a wired ZERO from low source impedances to the three input connections of the target subcode decoder 32.

Output window values from the output port of the data input portion 10 that are supplied to the bin decoder 71 and that are at least "0001 0000 000", but less than "0010 0000 000", are within the eighth addressing subrange of the bin decoder 71 and cause its otherwise-ZERO eighth bin response to be ONE. A ONE supplied from the eighth bin output connection of the bin comparator 71 conditions the bank 74 of tri-states to selectively apply the third leadmost bit of the output window value, the fourth leadmost bit of the output window value, and a wired ONE from low source impedances to the three input connections of the target subcode decoder 42.

Output window values from the output port of the data input portion 10 that are supplied to the bin decoder 71 and that are at least "0100 0000 000", but less than "1000 0000 000", are within the ninth addressing subrange of the bin decoder 71 and cause its otherwise-ZERO ninth bin response to be ONE. A ONE supplied from the ninth bin output connection of the bin comparator 71 conditions the bank 75 of tri-states to selectively apply the first, second and third leadmost bits of the output window value from low source impedances to the three input connections of the target subcode decoder 42.

Output window values from the output port of the data input portion 10 that are supplied to the bin decoder 71 and that are at least "0001 0000 000" are within the tenth addressing subrange of the bin decoder 71 and cause its otherwise-ZERO tenth bin response to be ONE. A ONE supplied from the tenth bin output connection of the bin comparator 71 conditions the bank 76 of tri-states to selectively apply wired "001" from low source impedances to the three input connections of the target subcode decoder 42.

Generally, the memory reduction technique described in connection with FIG. 9 is one in which addressing subranges that together contain fewer codes than can be described by a target code of prescribed bit-width are arranged to address a single address line, rather than plural lines, and target subcode portions of the Huffman codes are recoded to avoid similarity of target subcode from the different addressing subranges that are arranged to address the single address line. This general memory reduction technique can be further applied to address a single address line with codes in the fifth addressing subrange and in one of the fourth and sixth addressing subranges. This general memory reduction technique can be still further applied to address a single address line with codes in the first and third addressing subranges.

The multiplexers used for selecting target subcodes have been described as being constructed from banks of tri-states, since it is easier to describe step-by-step the operation of such a multiplexer. Other known forms of multiple-input multiplexer can be used instead, of course. It is also possible to decode all possible target subcodes and then enable the application of the selected target subcode to the memory address lines.

If some of the Huffman codes are longer than sixteen bits, the longest of them having L bits where 16<L<32, the controlled data shifter 13 is replaced by a controlled data shifter having an input port 2L−1 bits wide and an output port L bits wide and capable of shifts towards greater significance of up to L−1 bits. Supposing the host processor supplies input data in 16-bit bytes, the cascaded clocked latches 11 and 12 are augmented by two more clocked latches in the cascade connection. The accumulator 14 is replaced by an accumulator that accumulates modulo-64, and the five least significant bits of the accumulation result are supplied as a data shift control signal to the replacement controlled data shifter. The data requirement signal generator 15 is modified to sense change in the most significant bit of the modulo-64 accumulation result. Change in this bit is used to generate not one but two clock pulses for clocking the cascaded clocked latches and for controlling the supply of input data from the host processor. The modifications required to accommodate a host processor that supplies input data in 8-bit bytes should be evident to one skilled in the art of digital design and acquainted with the foregoing description.

Korean patent application No. 94-15677 filed 30 Jun. 1994, from which priority is claimed under 35 U.S.C. § 119, is incorporated herein by reference, as non-essential matter.

What is claimed is:

1. A decoder for variable-length coding composed of concatenated variable-length code words, at least some of which said code words are composed of pointer and target subcodes, said decoder comprising:

a controlled data shifter receptive of unshifted said variable-length coding and responsive to a shift indication supplied thereto for shifting a selected portion of said variable-length coding to be positioned within an output window as wide as the longest variable-length code word, said shift indication being a binary number indicative of a number of bit places of desired shift for the selected portion of said variable-length coding to be positioned within said output window of said controlled data shifter;

an accumulator for accumulating code-word bit-length indications to generate said shift indication;

a first memory having a plurality of addressable storage locations a selected one of which is accessed for reading during first times responsive to said selected portion of said variable-length coding as positioned within said output window of said controlled data shifter, storing at each of its addressable storage locations a decoding result for a first decoding table, also storing at each of its addressable storage locations a binary number descriptive of the code bit-length of a variable-length code word as would give rise to the decoding result stored at that addressable storage location, and supplying from each one of the addressable storage locations in said first memory successively addressed during said first times the decoding result and the binary number descriptive of the code-word bit-length which are stored at that addressable storage location, said first memory having address lines for accessing its addressable storage locations and having first memory addressing circuitry that responds to said selected portion of said variable-length coding as positioned within said output window of said controlled data shifter to drive said address lines of said first memory;

means for supplying the code-word bit-length read from said first memory during said first times to said accumulator for accumulation;

a bin comparator included within said first memory addressing circuitry and connected to respond to ones of the leadmost bits of the selected portion of said variable-length coding positioned within said output window of said controlled data shifter, which said leadmost bits can describe a pointer subcode of a code word, for supplying from respective output connections of said bin comparator a respective bin response to each pointer subcode and a further bin response to the lack of a pointer subcode, the respective output connections of said bin comparator connecting to respective ones of a first group of some but not all of said address lines of said first memory;

an address decoder for decoding said target subcode, said address decoder being included within said first memory addressing circuitry and having respective output connections to respective ones of a second group of said address lines of said first memory, said second group containing those of said address lines of said first memory not contained in said first group of them; and a multiplexer included within said first memory addressing circuitry, said multiplexer being responsive to the bin responses of said bin comparator for selecting said target subcode for application to said address decoder, said multiplexer selecting said target subcode at least in part from the selected portion of said variable-length coding positioned within said output window of said controlled data shifter.

2. A decoder as set forth in claim 1 wherein the binary number descriptive of the code bit-length of a variable-length code word as would give rise to the decoding result stored at that addressable storage location has a value equal to the number of bits in said variable-length code word.

3. A decoder as set forth in claim 1 wherein the binary number descriptive of the code bit-length of a variable-length code word as would give rise to the decoding result stored at that addressable storage location has a value equal to one less than the number of bits in said variable-length code word.

4. A decoder as set forth in claim 1 further comprising:

a second memory having a plurality of addressable storage locations a selected one of which is accessed for reading during second times responsive to said selected portion of said variable-length coding as positioned within said output window of said controlled data shifter, storing at each of its addressable storage locations a decoding result for a second decoding table, also storing at each of its addressable storage locations a binary number descriptive of the bit-length of a variable-length code word as would give rise to the decoding result stored at that addressable storage location, and reading out from each one of the addressable storage locations in said second memory successively addressed during said second times the decoding result and the binary number descriptive of the bit-length of the variable-length code word as would give rise to the decoding result which are stored at that addressable storage location; and means for supplying the code-word bit-length read from said second memory during said second times to said accumulator for accumulation.

* * * * *